(12) United States Patent
Nolan

(10) Patent No.: US 7,780,787 B2
(45) Date of Patent: Aug. 24, 2010

(54) APPARATUS AND METHOD FOR DEPOSITING A MATERIAL ON A SUBSTRATE

(75) Inventor: James F. Nolan, Lady Lake, FL (US)

(73) Assignee: First Solar, Inc., Perrysburg, OH (US)

( * ) Notice: Subject to any disclaimer, the term of this patent is extended or adjusted under 35 U.S.C. 154(b) by 319 days.

(21) Appl. No.: 10/915,695

(22) Filed: Aug. 11, 2004

(65) Prior Publication Data

US 2006/0032440 A1 Feb. 16, 2006

(51) Int. Cl.
*C23C 16/00* (2006.01)
*H01L 21/306* (2006.01)

(52) U.S. Cl. .................. 118/715; 156/345.33

(58) Field of Classification Search ............... 118/715, 118/718, 726; 156/345.33
See application file for complete search history.

(56) References Cited

U.S. PATENT DOCUMENTS

| | | | |
|---|---|---|---|
| 4,083,708 A | 4/1978 | Heath et al. | |
| 4,401,052 A | 8/1983 | Baron et al. | |
| 4,947,790 A * | 8/1990 | Gartner et al. | 118/715 |
| 4,997,677 A | 3/1991 | Wang et al. | |
| 5,071,678 A | 12/1991 | Grybowski et al. | |
| 5,182,567 A | 1/1993 | Wilder | |
| 5,204,314 A | 4/1993 | Kirlin et al. | |
| 5,248,349 A | 9/1993 | Foote et al. | |
| 5,372,646 A | 12/1994 | Foote et al. | |
| 5,372,648 A | 12/1994 | Yamamoto et al. | |
| 5,470,397 A | 11/1995 | Foote et al. | |
| 5,536,333 A | 7/1996 | Foote et al. | |
| 5,596,673 A | 1/1997 | Ward et al. | |
| 5,626,677 A | 5/1997 | Shirahata | |
| 5,683,516 A * | 11/1997 | DeDontney et al. | 118/718 |
| 5,741,363 A * | 4/1998 | Van Buskirk et al. | 118/715 |
| 5,807,615 A | 9/1998 | Sindzingre et al. | |
| 5,835,678 A | 11/1998 | Li et al. | |
| 5,882,416 A | 3/1999 | Van Buskirk et al. | |
| 5,945,163 A | 8/1999 | Powell et al. | |
| 6,037,241 A * | 3/2000 | Powell et al. | 438/479 |
| 7,191,785 B2 * | 3/2007 | Toshima et al. | 134/58 R |
| 7,534,362 B2 * | 5/2009 | Savas | 216/58 |
| 2003/0198741 A1 * | 10/2003 | Uchida et al. | 427/248.1 |

OTHER PUBLICATIONS

Webster's Ii , New Riverside University Dictionary, p. 875.*

* cited by examiner

*Primary Examiner*—Ram N Kackar
*Assistant Examiner*—Satish Chandra
(74) *Attorney, Agent, or Firm*—Steptoe & Johnson LLP

(57) ABSTRACT

Apparatus and a method for depositing a material on a substrate utilizes a distributor including a permeable member through which a carrier gas and a material are passed to provide a vapor that is deposited on a conveyed substrate. A secondary gas can be provided to promote uniform distribution of the material on the substrate.

24 Claims, 8 Drawing Sheets

APPARATUS AND METHOD FOR DEPOSITING A MATERIAL ON A SUBSTRATE

TECHNICAL FIELD

This invention relates to apparatus and a method for depositing a material on a substrate.

BACKGROUND

A photovoltaic cell can include a semiconductor layer deposited on a substrate, such as glass. For example, a continuous process for deposition of semiconductor material as a layer on a glass sheet substrate can rely on source material troughs in which the semiconductor material is received, within a heated processing chamber. The source material can be sublimed from the troughs to deposit the semiconductor material on a surface of glass sheets conveyed below the troughs. This construction requires that the source material troughs be replenished periodically. Alternatively, the source material can be conveyed by a carrier gas to a distributor which deposits the semiconductor layer on the substrate.

SUMMARY

During the production of a photovoltaic device, a semiconductor material is deposited on a substrate, such as a glass sheet. The performance of the photovoltaic device can be enhanced when the semiconductor material is deposited as a layer having uniform properties, such as, for example, thickness, grain size and composition, and combinations thereof. The layer can be a uniform layer, which can be uniform in thickness and in the microstructure of the semiconductor. A distributor for depositing the semiconductor material on the substrate can include a secondary gas source. The secondary gas source can be configured to provide a uniform gas flow or a non-uniform gas flow in the distributor. The use of a secondary gas source can result in increased uniformity of the semiconductor material layer. For example, the standard deviation in thickness for a semiconductor layer with an average thickness of 3.3 µm can be improved from 0.4 µm to 0.2 µm with the use of a secondary gas.

In one aspect, an apparatus for depositing a material on a substrate includes a permeable member configured to be heated to a delivery temperature, a material supply conduit connected to the permeable member for supplying a carrier gas and a material to the permeable member, a secondary gas supply having at least one orifice internal to the permeable member configured to supply a secondary gas to the permeable member, and a conveyor configured to convey a substrate adjacent the permeable member.

In another aspect, a distributor for depositing a material on a substrate includes a permeable member configured to be heated to a delivery temperature, and a secondary gas supply having at least one outlet internal to the permeable member configured to supply a secondary gas to the permeable member.

In another aspect, an apparatus for depositing a material on a substrate includes a distributor including a permeable member having an elongated shape having opposite ends configured to be heated to a delivery temperature and to provide a vapor that passes outwardly through the permeable member, and a secondary gas supply internal to the permeable member for supplying a secondary gas, a pair of material supply conduits for introducing a carrier gas and a powder of a material into the opposite ends of the permeable member, a shroud at least partially surrounding the permeable member, the shroud having an opening formed as a slit along the length of the permeable member, and a conveyor configured to convey a substrate below the distributor.

The permeable member can have a generally tubular shape. The material supply conduit can be configured to introduce the carrier gas and the material to an interior portion of the permeable member. The permeable member can be configured to be connected to a source of electrical power to heat the permeable member to the delivery temperature. The permeable member can be a tube including silicon carbide.

The apparatus can include a shroud having a generally tubular shape that receives the permeable member. The shroud can have an opening through which the vapor passes for the deposition on the substrate. The opening of the shroud can be a slit that extends along the length of the shroud. The shroud can have opposite ends between which the slit has a varying size. The shroud can include a ceramic material. The ceramic material can be mullite.

The orifice can be a hole. The orifice can be a nozzle. The secondary gas supply can include a plurality of orifices. The plurality of orifices can be configured to provide a substantially uniform distribution of a vapor of the material from the permeable member.

The secondary gas supply can have a generally tubular shape and can be contained within the permeable member. The plurality of orifices can be positioned at regular intervals or at irregular intervals. along a length of the secondary gas supply. The plurality of orifices can be configured to proved a substantially uniform flow of gas from the permeable member.

The apparatus can include a plurality of secondary gas supplies. Each secondary gas supply has at least one orifice internal to the permeable member configured to supply a secondary gas to the permeable member. Each secondary gas supply can have a generally tubular shape and can be contained within the permeable member, and the plurality of secondary gas supplies can be generally parallel. A first secondary gas supply of the plurality can have an orifice located in a zone along the tubular shape of the first secondary gas supply, where a corresponding zone along the tubular shape of a second secondary gas supply is free of an orifice.

The material supply conduit can be configured to introduce the carrier gas and the material into one end of the permeable member. The apparatus can include a second material supply conduit configured to introduce the carrier gas and the material into the other end of the permeable member. The material supply conduit can include a rotary screw and a gas passage into which the rotary screw is configured to introduce a powder of the material for flow with the carrier gas. The material supply conduit can include a vibratory feeder and a gas passage into which the vibratory feeder is configured to introduce a powder of the material for flow with the carrier gas.

The conveyor can support the substrate in a horizontally extending orientation, and the permeable member can be located above the conveyor. The conveyor can include a plurality of rollers. The permeable member can be located above the conveyance path of the substrate to deposit the material on the upwardly facing surface of the substrate. The conveyor can include a gas hearth configured to support and convey the substrate in a generally horizontally extending orientation.

In another aspect, a method for depositing a material on a substrate includes heating a permeable member, passing a carrier gas and a material into the permeable member for heating to provide a vapor via a material supply conduit, passing a secondary gas into the heated permeable member via a gas supply, and conveying a substrate adjacent the permeable member for depositing the vapor as a layer of the material on the substrate.

The permeable member can have a tubular shape with opposite ends, and heating the permeable member can include applying an electrical voltage across opposite ends of the permeable member.

The vapor can be guided around the exterior of the permeable member with a shroud and the vapor can be passed outwardly through an opening in the shroud for the deposition on the substrate.

The gas supply can include an orifice for introducing the secondary gas into the permeable member. The secondary gas can be passed into the heated permeable member via a plurality of gas supplies. The method can include introducing the material as a powder into the carrier gas. The material can be introduced by a rotary screw or by a vibratory feeder. The carrier gas can be helium.

The substrate can be conveyed in a horizontally extending orientation thereby providing the substrate with a downwardly facing surface and an upwardly facing surface. The vapor can be deposited on the upwardly facing surface of the conveyed substrate. The substrate can be conveyed by a gas hearth in a generally horizontally extending orientation thereby providing the substrate with an upwardly facing surface and a downwardly facing surface. The vapor can be deposited on the downwardly facing surface of the conveyed substrate. The material can be a semiconductor. The substrate can be a glass sheet.

In yet another aspect, a method for depositing a material on a substrate includes heating a permeable member, altering flow of a vapor of a material to be deposited within the permeable member to provide substantially uniform distribution exiting the permeable member, and conveying a glass sheet substrate adjacent the permeable member for deposition of the vapor on the substrate as a layer.

The method can include passing a secondary gas into the permeable member to provide substantially uniform gas flow from the permeable member.

The details of one or more embodiments are set forth in the accompanying drawings and the description below. Other features, objects, and advantages will be apparent from the description and drawings, and from the claims.

DETAILED DESCRIPTION

Methods of depositing material on a substrate have been described in, for example, U.S. Pat. Nos. 5,248,349, 5,372,646, 5,470,397, 5,536,333, 5,945,163, and 6,037,241, each of which is incorporated by reference in its entirety.

Figure 1:
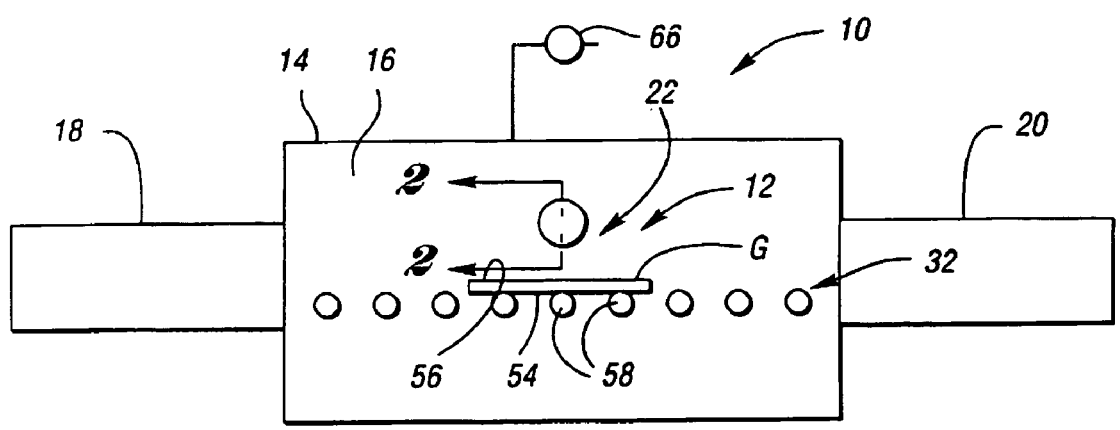
FIG. 1 is a schematic view illustrating an apparatus for depositing a material on a substrate.

With reference to FIG. 1 of the drawings, a processing system generally indicated by 10 includes apparatus 12 constructed to perform a method of depositing material on a substrate. Both the apparatus 12 and the method of depositing the material are more fully described below.

The specific processing system 10 processes substrate G (for example, a glass sheet) for deposition of a material (for example, a semiconductor material, such as a II-VI semconductor, including CdTe, CdSe, and CdS). Other substrates and deposition materials can also be utilized. For example, other materials that become semiconductors upon further processing may be deposited, such as $In_2Se_3$ and $Ga_2Se_3$. These can be further processed to subsequently provide $CuIn_x$ and $Ga_{1-x}Se_2$, respectively. The deposition may be on a metal substrate such as a foil. Materials with high vapor pressures at moderate temperatures, such as Zn, Pb, etc., can be deposited using the methods and apparatus.

With continuing reference to FIG. 1, the system 10 includes a housing 14 defining a processing chamber 16 in which a material is deposited on substrate G. Housing 14 includes an entry station 18 and an exit station 20. These entry and exit stations 18 and 20 can be constructed as load locks or as slit seals through which the glass sheet substrates G enter and exit the processing chamber 16. The interior of housing 14 can be heated in any suitable manner such as disclosed by U.S. Pat. Nos. 5,248,349, 5,372,646, 5,470,397 or 5,536,333, such that the processing chamber is maintained at a temperature ranging from 400° C. to 900° C., 450° C. to 800° C., or 500° C. to 700° C. The substrate can be heated during the processing to a slightly lower temperature, for example, of a temperature ranging from 400° C. to 650° C.

Figure 2A:
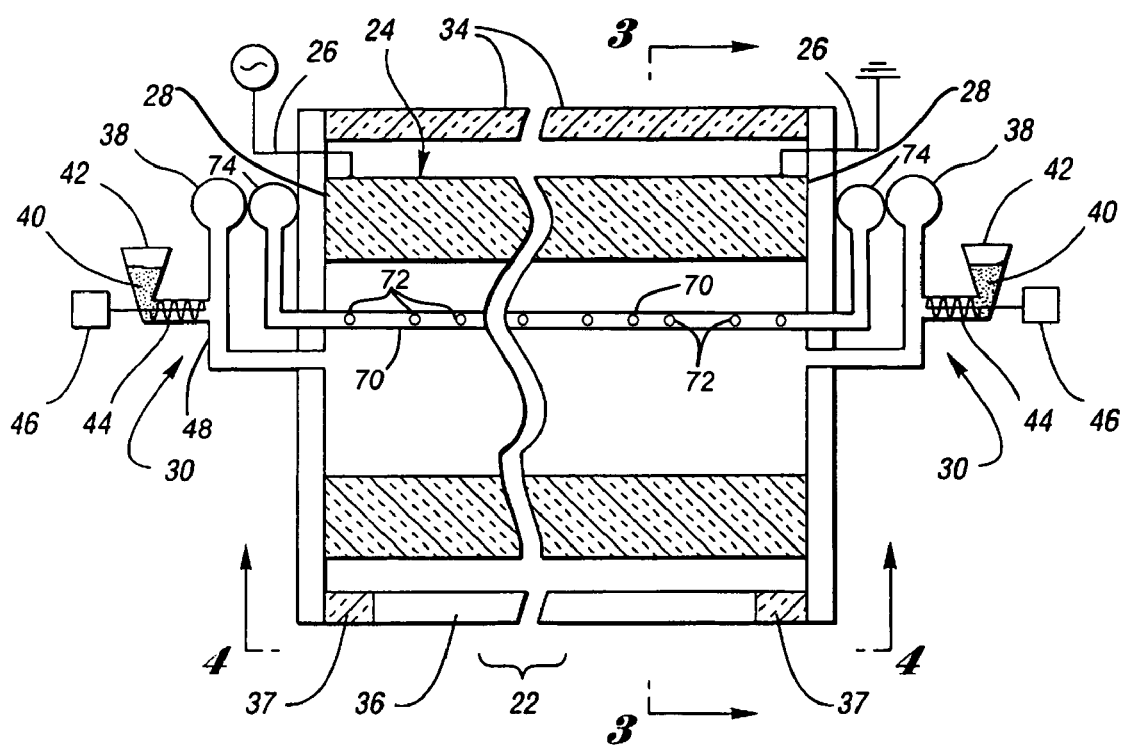
FIGS. 2A and 2B are partially broken-away sectional views taken through a distributor of the apparatus along the direction of line 2-2 in FIG. 1 and illustrates a pair of material supplies for introducing a carrier gas and a material into opposite ends of a tubular permeable member.
Figure 2B:
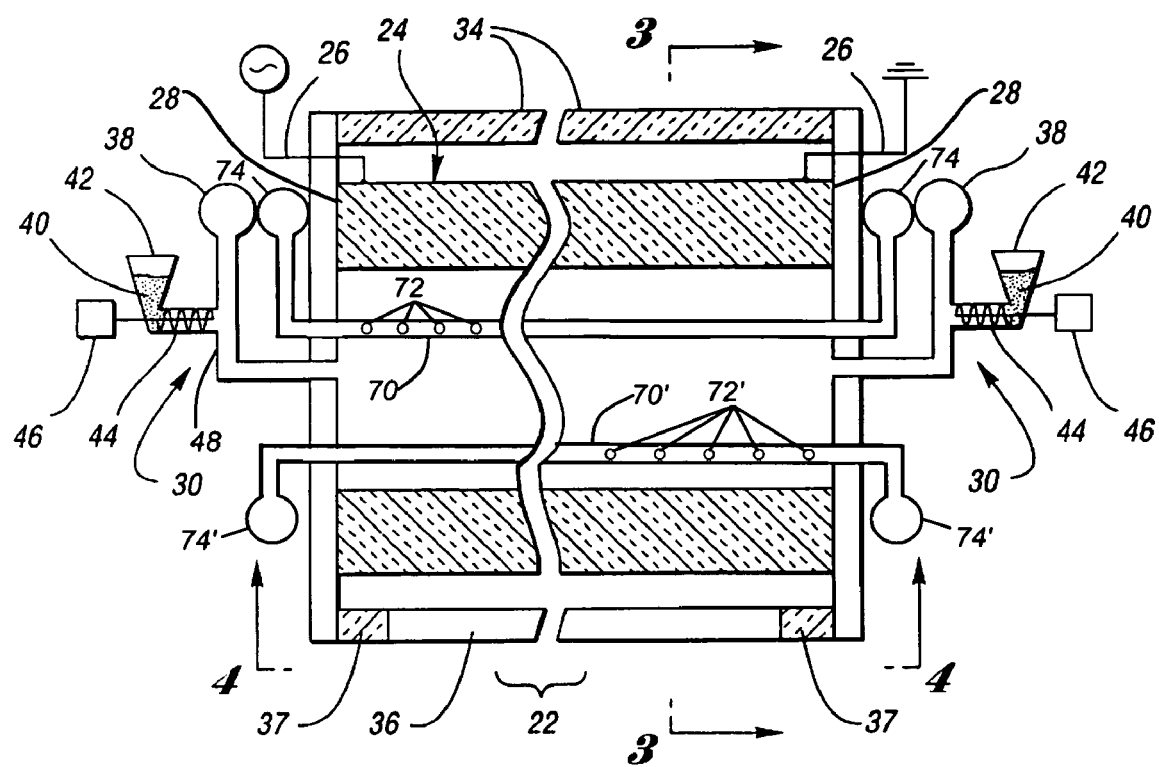

With reference to FIGS. 2A and 2B, the apparatus includes a distributor 22 having a permeable member 24 of a tubular shape having an elongated construction. The tubular permeable member 24 is heated during use. When permeable member 24 is electrically conductive, it can be heated by application of a voltage along the length of the member. The voltage is applied by electrical connections 26 at opposite ends of the member. This voltage causes an electrical current to flow along the length of the tubular permeable member 24, electrically heating the member during the processing. The tubular permeable member 24 can be heated to a temperature ranging from 850° C. to 1150° C. At least one material supply 30 of the apparatus 12 is provided for introducing a carrier gas and a material to be deposited into the tubular permeable member 24. Inside permeable member 24 the material is heated to a delivery temperature to provide a vapor that passes outwardly through the tubular permeable member during the processing. The delivery temperature is selected in combination with a pressure inside the chamber 16 to provide a suitable vapor pressure of the material. A conveyor 32 of the apparatus conveys a substrate G adjacent the distributor 22 for deposition of the vapor on the substrate.

The tubular permeable member 24 can be made of silicon carbide, permeable carbon or any other permeable material that is preferably electrically conductive to provide the heating in the manner disclosed. Distributor 22 preferably includes secondary gas tube 70 to introduce a secondary gas to the interior of permeable member 24. The secondary gas can be an inert gas such as helium or nitrogen, or the secondary gas can be a reactive gas, such as oxygen. The carrier gas and secondary gas can be the same gas or different gases. A secondary gas is carried from secondary gas source 74 through secondary gas tube 70 and passes out of secondary gas tube 70 through ports 72 and into permeable member 24. Ports 72 can be holes, slits, or nozzles, for example, and can have different diameters or all have the same diameter. Ports 72 can be distributed regularly or irregularly along secondary gas tube 70. The ports can be pointed toward or away from a surface of the substrate. Secondary gas tube 70 can include 1, 2, 3, 4, 5, 6, 7, 8, 9, 10 or more ports. The ports can have a diameter of less than 0.25 inches, such as less than 0.2 inches, less than 0.1 inches, or less than 0.05 inches. The secondary gas tube 70 can extend along a portion of the permeable member 24, or can extend for the entire length of the permeable member 24. The length of secondary gas tube 70, and the location and diameters of ports 72 can be selected to provide uniform gas flow through the walls of permeable member 24. For example, in regions of permeable member 24 where the flow of carrier gas is low, the secondary gas tube 70 can be configured to provide a high flow of secondary gas; and in regions of permeable member 24 where the flow of carrier gas is high, the secondary gas tube 70 can be configured to provide a low flow of secondary gas. The gas flow rate for the secondary gas can be less than 10 standard liters per minute, such as less than 5, less than 3, less than 2, or less than 1 standard liter per minute. The secondary gas flow rate can be greater than 0.1 standard liter per minute. For example, secondary gas flow rate can be between 0.2 and 3.0 standard liters per minute. Preferably, the material vapor exits the permeable member in a uniform distribution along the length of the permeable member. In other words, the mass density of material (i.e. the amount of material per cubic centimeter) exiting the permeable member in a given time is substantially the same at all points along the length of the permeable member.

As shown in FIG. 2B, distributor 22 can include additional secondary gas tube 70' having ports 72' and connected to secondary gas source 74'. Alternatively additional secondary gas tube 70' can receive secondary gas from secondary gas source 74. The flow rate of secondary gas in each secondary gas tube can be independently controlled. When more than one secondary gas tube is used, the ports in each secondary gas tube can be located in a different region along the length permeable member 24. In FIG. 2B, ports 72' are located closer to one end of permeable member 24 than the other end, and secondary gas tube 74 is free of ports in this region; ports 72 are located toward the far end of permeable member 24 with respect to ports 72', and secondary gas tube 74' is free of ports in this region. Such a configuration of ports can allow independent control over secondary gas flow in selected regions along permeable member 24 by changing the gas flow rate in a particular secondary gas tube. Additional control over secondary gas flow through the walls of permeable member 24 can be achieved by controlling which end of the secondary gas tube 70 or 70' the secondary gas is supplied from. Permeable member 24 can accommodate a plurality of secondary gas tubes, such as 1, 2, 3, 4, 5, more than 5, more than 10, or more than 12. In some cases, the distributor includes 1, 2, 3, 4, or 5 secondary gas tubes.

Figure 3A:
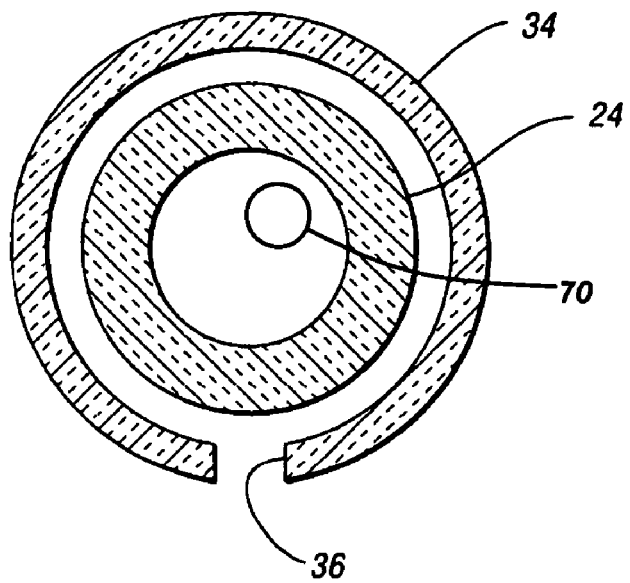
FIGS. 3A and 3B are sectional views through the distributor taken along the direction of line 3-3 in FIG. 2.
Figure 3B:
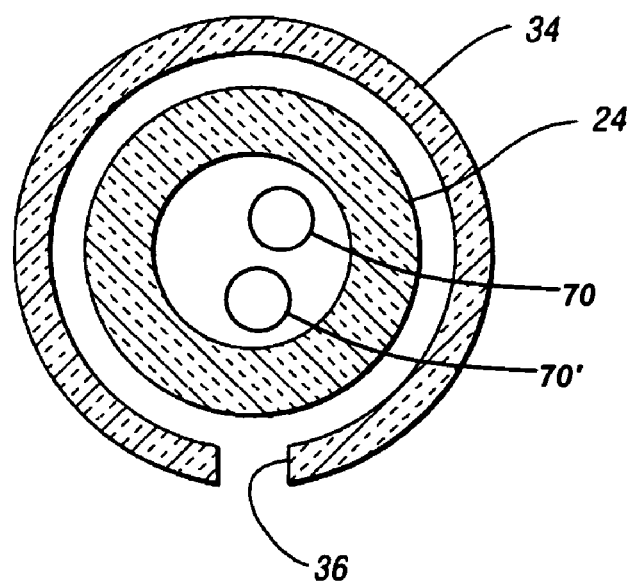
Figure 4:
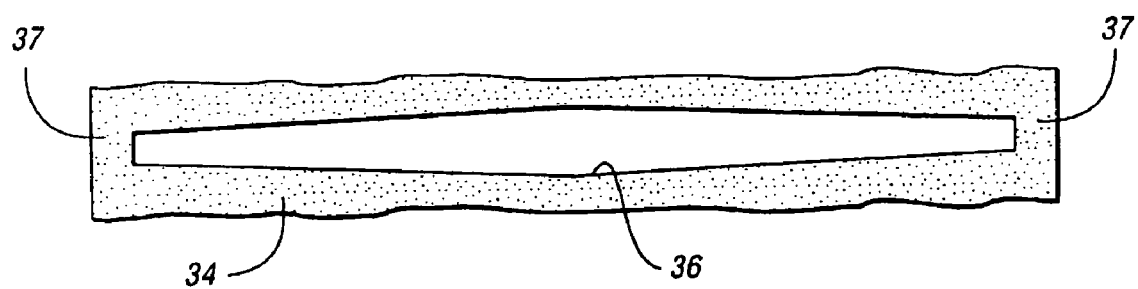
FIG. 4 is a bottom plan view taken along the direction of line 4-4 of FIG. 2 to illustrate a varying size slit opening of a shroud of the apparatus.

Additionally, a distributor preferably includes a shroud 34 of a generally tubular shape that receives the tubular permeable member 24, which in turn can include secondary gas tube 70 or a plurality of such tubes 70 and 70', the secondary gas is supplied from, as illustrated in FIGS. 3A and 3B. The shroud 34 guides the vapor generated by heating the material to be deposited around the exterior of the tubular permeable member 24 and has an opening 36 through which the vapor passes for the deposition of the semiconductor layer on a surface of the substrate G. More specifically, the preferred construction of the shroud 34 has the opening 34 constructed as a slit that extends along the tubular shape of the shroud. The shroud 34 as shown in FIG. 4 has opposite ends 37 between which the slit-shaped opening 36 can have a varying size which facilitates distribution of the vapor and uniform deposition of the semiconductor layer. More specifically, the slit-shaped opening 36 has a smaller size adjacent the ends 37 where the carrier gas and semiconductor material are introduced (described below), and has a larger size at the central more remote area from that introduction so as to provide the uniform deposition. To provide uniform distribution of the semiconductor material, it may be desirable to provide the interior of the tubular permeable member 24 with a suitable diverter that provides a uniform passage of the vapor outwardly along the length of the tubular permeable member and then along the length of the slit-shaped opening 36 of the shroud. Furthermore, the shroud 34 is preferably made of a ceramic material. The ceramic material is selected so that it does not react with the vapor. For example, the ceramic material can be mullite.

The shroud 34 also can advantageously reduce radiant heat transfer from the hot tubular permeable member 24 to the substrate G. More specifically, the amount of energy the shroud 34 radiates to the glass sheet substrate is reduced because its outside surface temperature is lower than that of the hot tubular permeable member 24. Mullite has an adequately low emissivity and is relatively strong and easy to fabricate. In addition, it should be appreciated that coatings can be provided to lower the emissivity of the outer surface of the shroud 34 such as $Al_2O_3$ or $Y_2O_3$.

The length of the slit-shaped opening 36 of the shroud 34 can be selected to control the width of the deposited layer on the substrate. Thus, the length of the split-shaped opening 36 can be selected to be less than the width of the substrate to provide a strip of the deposited layer. Such control can also minimize waste of the material. When the entire width of the substrate is to be covered, one can ideally make the length of the slit-shaped opening 36 equal to or slightly less than the width of the substrate such that the substantially all of the vapors are deposited onto the substrate during the deposition.

To provide efficient deposition, the shroud 34 can be spaced from the conveyed glass sheet substrate a distance in the range of 0.5 to 3.0 centimeters. Greater spacings can be utilized, but generally require lower system pressures and can result in waste of material due to overspraying. Furthermore, smaller spacing can cause thermal warping of the substrate during conveyance.

As illustrated in FIG. 2, the material supply 30 introduces a carrier gas from a source 38 and a material (e.g. a semiconductor material) as a powder 40 from a hopper 42 into one end 28 of the tubular permeable member 24, and there is also another material supply 30 that likewise introduces a carrier gas and a semiconductor material as a powder into the other end 28 of the tubular permeable member 24. As such, there is a good distribution of the carrier gas and entrained semiconductor powder along the entire length of the tubular permeable member 24.

With continuing reference to FIG. 2, each of the material supplies 30 illustrated includes a rotary screw 44 that receives the material 40 from the hopper 42 and is rotationally driven by a suitable actuator 46. A passage 48 extends from the carrier gas source 38 to the adjacent end 28 of the porous tubular member 24 in communication with the rotary screw 44. Rotation of the screw 44 at a controlled rate introduces the material 40 into the passage 48 so as to be entrained therein for flow into the tubular permeable member 24 for the heating that provides the vapor.

Figure 5:
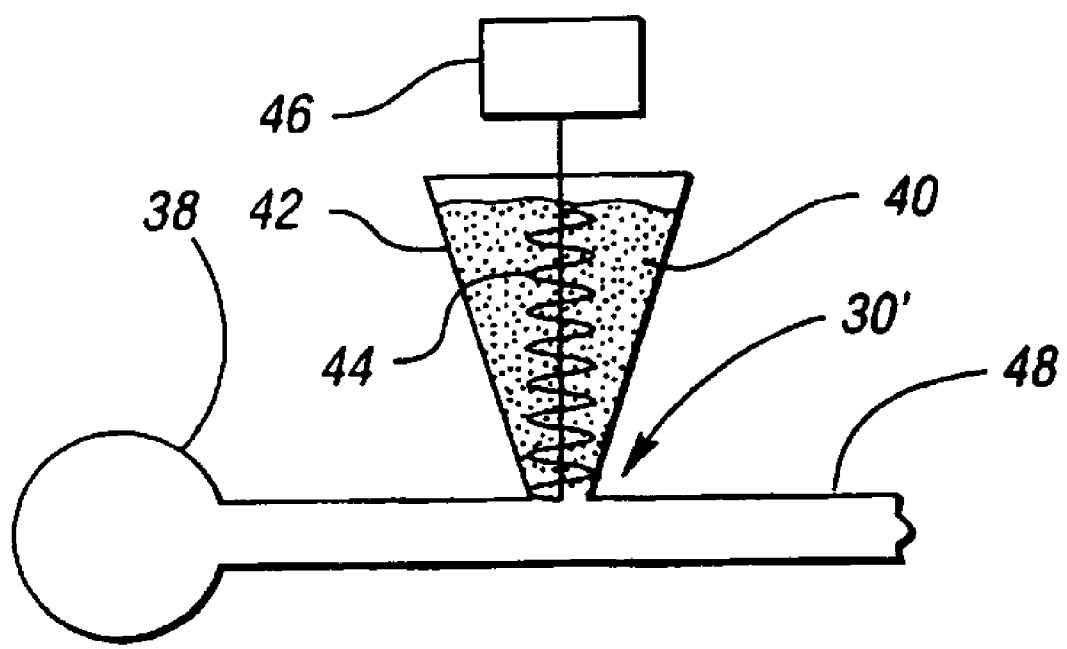
FIG. 5 is a view illustrating an alternate embodiment of the material supply which includes a rotary screw that rotates about a vertical axis as opposed to rotating about a horizontal axis as illustrated in FIG. 2.
Figure 6:
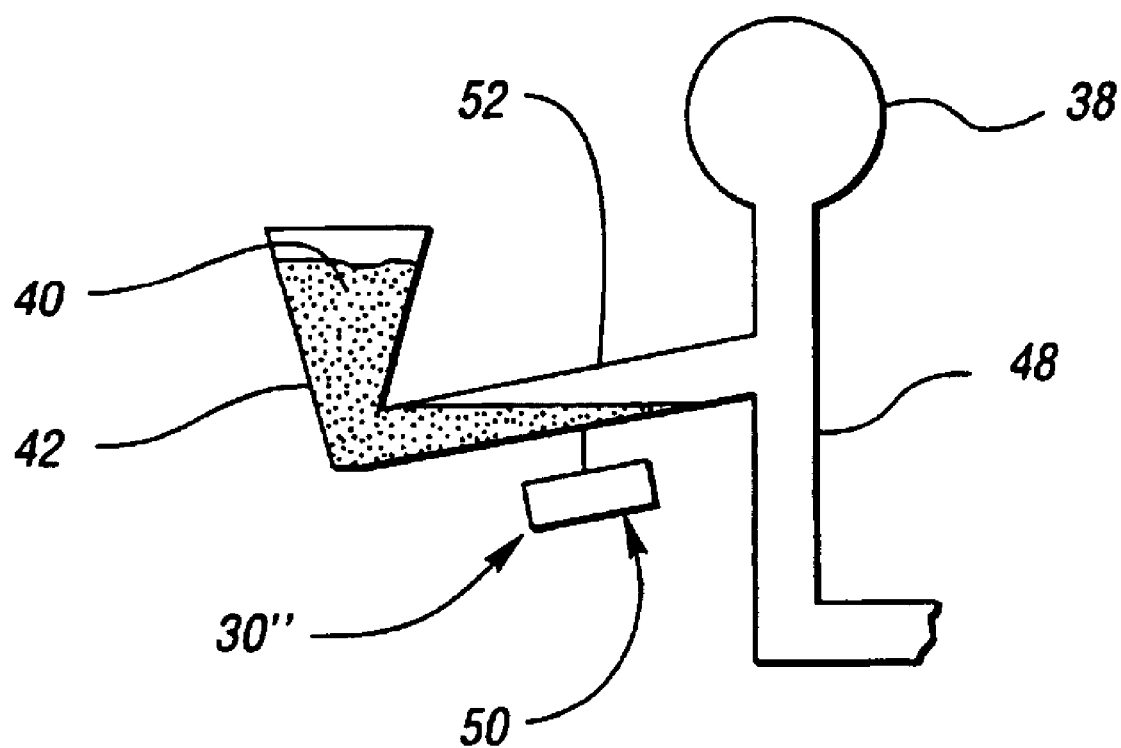
FIG. 6 is a view of a further embodiment of the material supply which includes a vibratory feeder.

FIGS. 2, 5 and 6 respectively disclose different embodiments of the material supplies 30, 30' and 30". More specifically, the embodiment of the material supply 30 illustrated in FIG. 2 has the screw 44 rotated about a horizontal axis for introduction of the material 40 into the carrier gas passage 48, while the FIG. 5 embodiment of the material supply 30' has the screw 44 rotated about a vertical axis for introduction of the material 40 from the hopper 42 into the carrier gas passage 48. With each of these screw embodiments of the material supplies, the amount of material introduced as a powder can be accurately controlled by the rate of screw rotation. Furthermore, the FIG. 6 embodiment of the material supply 30" includes a vibratory feeder 50 having an inclined passage 52 extending upwardly from the hopper 42 to the carrier gas passage 48. Operation of the vibratory feeder 50 can cause vibration of the material 40 which moves it upwardly along the inclined passage 52 to the carrier gas passage 48 for flow as an entrained powder into the tubular permeable member 24.

Other types of material supplies can also be utilized for feeding the material including fluidized bed feeders and rotary disk feeders that are commercially available. The powder feed rate and the speed of conveyance of the substrate directly control the film thickness such that the carrier gas flow rate, powder feed rate, and substrate conveyance speed all must be controlled. Also, starting and stopping of the powder feed can be utilized to commence and terminate the deposition of the material on the substrate.

Figure 7:
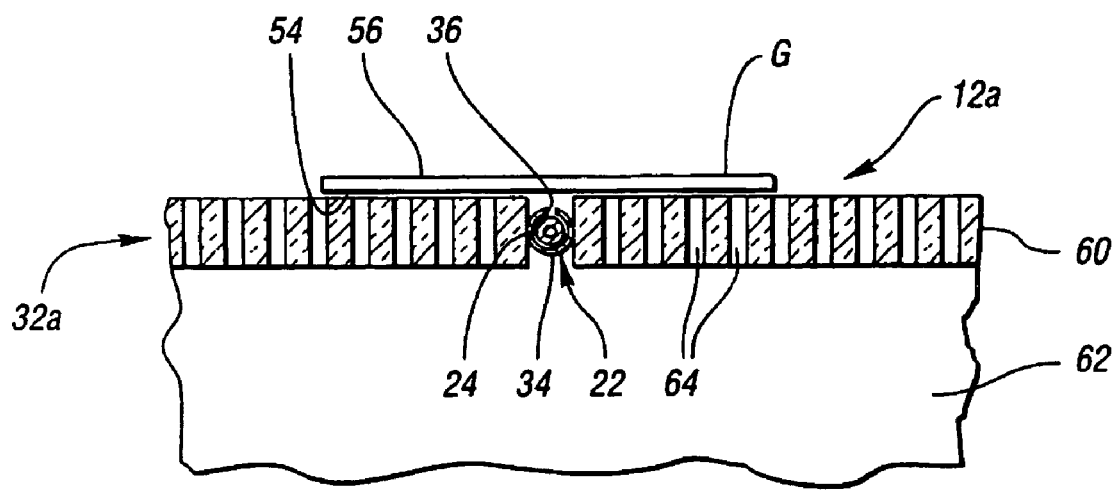
FIG. 7 is a view illustrating another embodiment where the material is deposited on a downwardly facing surface of the conveyed substrate as opposed to being deposited on an upwardly facing surface thereof as shown in FIG. 1.

Two different embodiments of the apparatus 12 and 12a respectively illustrated by FIGS. 1 and 7 both support the substrate G in a horizontally extending orientation so as to have downwardly and upwardly facing surfaces 54 and 56.

In the embodiment of FIG. 1, the distributor 22 is located above the conveyor 32 so as to deposit the material on the upwardly facing surface 56 of the substrate G. Furthermore, this embodiment of the apparatus discloses the conveyor 32 as being of the roll type including rolls 58 that support the downwardly facing surface 54 of the substrate for its conveyance during the processing.

In the embodiment of FIG. 7, the apparatus 12a has the conveyor 32a constructed as a gas hearth for supporting the substrate G for conveyance. More specifically, the gas hearth conveyor 32a includes a refractory hearth 60 above a plenum 62 of heated pressurized gas. Holes 64 in the hearth 60 provide for the upward flow of the pressurized heated gas so as to support the substrate G in a floating manner. The hearth 60 in accordance with conventional construction can also include exhaust openings through which the gas escapes back downwardly through the hearth into a suitable return chamber that is not illustrated. In this gas hearth construction of the conveyor 32a, the distributor 22 is located below the substrate G to deposit the semiconductor layer on its downwardly facing surface 54. Thus, the opening 36 provided by the slit in the shroud 34 is at the upper extremity of the distributor 22 in this embodiment, unlike the embodiment of FIG. 1 where the slit opening 36 is at the lower extremity of the shroud.

It should also be appreciated that the gas hearth conveyor can be utilized with a distributor located above the conveyed substrate so as to provide the deposition on its upper surface as in the embodiment of FIG. 1 and unlike the embodiment of FIG. 7 which provides the deposition on the lower surface.

In performing the deposition, successful results have been achieved using cadmium telluride and cadmium sulfide as the material. Other materials can be utilized including semiconductors including elements of Group II and Group VI, as well as compounds including these elements, such as for example, zinc selenide, etc. and other materials that become semiconductors upon further processing, in addition to other materials as previously discussed. Also dopants may be useful in enhancing the deposition.

Use of the apparatus to perform the method has been performed with a vacuum drawn in the processing chamber 16 to in the range of 1 to 50 Torr. In that connection, as illustrated in FIG. 1, the processing system 10 includes a suitable exhaust pump 66 for exhausting the processing chamber 16 of the housing 14 both initially and continuously thereafter to remove the carrier gas and secondary gas.

The carrier gas supplied from the source 38 is most preferably helium which has been found to increase the glass temperature range and the pressure range that provide good semiconductor characteristics such as dense deposition and good bonding. The carrier gas can also be another gas such as nitrogen, neon, argon or krypton, or combinations of these gases. It is also possible for the carrier gas or the secondary gas to include a reactive gas such as oxygen that can advantageously affect growth properties of the semiconductor material. A flow rate of 0.3 to 10 standard liters per minute of the carrier gas provides the semiconductor material flow to the distributor 22 for the deposition.

EXAMPLE

In one test, providing helium as a secondary gas at a rate of 0.5 standard liters per minute at one end only of the distributor (i.e. the side away from the operator) caused the thickness of the applied semiconducting film to be reduced by about 0.2 μm on that end only, from 4.4 μm to 4.2 μm. Therefore, a distributor that produces a film with a variation in thickness of 0.4 μm across the substrate, where the film is thicker towards one side of the distributor, this variation can be reduced to 0.2 μm by applying the secondary gas to the region of the distributor corresponding to the thicker film.

Other embodiments are within the scope of the following claims.

What is claimed is:

1. An apparatus for depositing a material on a substrate, comprising:

a permeable member configured to be heated to a delivery temperature and to substantially uniformly distribute the material along the length of said permeable member as the material exits said permeable member;

a material supply conduit connected to said permeable member for supplying a carrier gas and a material to said permeable member;

a secondary gas supply having at least one orifice internal to said permeable member configured to supply a secondary gas to said permeable member, the secondary gas supply configured to provide a uniform gas flow through the walls of said permeable member; and a conveyor configured to convey a substrate adjacent said permeable member, wherein said secondary gas supply has a generally tubular shape and is contained within the permeable member, wherein said permeable member is configured to be connected to a source of electrical power to heat the permeable member to the delivery temperature, and, wherein the material supply conduit includes at least one of a rotary screw or a vibratory feeder and a gas passage into which the rotary screw or the vibratory feeder is configured to introduce a powder of the material for flow with the carrier gas.

2. The apparatus of claim 1, wherein the permeable member has a generally tubular shape, and the material supply conduit is configured to introduce the carrier gas and the material to an interior portion of the permeable member.

3. The apparatus of claim 2, further including a shroud having a generally tubular shape that receives the permeable member, the shroud having an opening through which the vapor passes for the deposition on the substrate.

4. The apparatus of claim 3, wherein the opening of the shroud is a slit that extends along the length of the shroud.

5. The apparatus of claim 4, wherein the shroud has opposite ends between which the slit has a varying size.

6. The apparatus of claim 3, wherein the shroud includes a ceramic material.

7. The apparatus of claim 6, wherein the ceramic material is mullite.

8. The apparatus of claim 2, wherein the material supply conduit is configured to introduce the carrier gas and the material into one end of the permeable member.

9. The apparatus of claim 8, further including a second material supply conduit configured to introduce the carrier gas and the material into the other end of the permeable member.

10. The apparatus of claim 1, wherein the permeable member is a tube including silicon carbide.

11. The apparatus of claim 1, wherein the orifice is a hole.

12. The apparatus of claim 1, wherein the orifice is a nozzle.

13. The apparatus of claim 1, wherein the secondary gas supply includes a plurality of orifices.

14. The apparatus of claim 13, wherein the plurality of orifices is configured to provide a substantially uniform distribution of a vapor of the material from the permeable member.

15. The apparatus of claim 13, wherein the plurality of orifices are configured to provide a substantially uniform flow of gas from the permeable member.

16. The apparatus of claim 1, wherein the plurality of orifices are positioned at regular intervals along a length of the secondary gas supply.

17. The apparatus of claim 1, wherein the plurality of orifices are positioned at irregular intervals along a length of the secondary gas supply.

18. The apparatus of claim 1, wherein the apparatus includes a plurality of secondary gas supplies, each secondary gas supply having at least one orifice internal to the permeable member configured to supply a secondary gas to the permeable member.

19. The apparatus of claim 18, wherein each secondary gas supply has a generally tubular shape and is contained within the permeable member, and the plurality of secondary gas supplies are generally parallel.

20. The apparatus of claim 19, wherein a first secondary gas supply of the plurality has an orifice located in a zone along the tubular shape of the first secondary gas supply, wherein a corresponding zone along the tubular shape of a second secondary gas supply is free of an orifice.

21. The apparatus of claim 1, wherein the conveyor supports the substrate in a horizontally extending orientation, and the permeable member being located above the conveyor.

22. The apparatus of claim 21, wherein the conveyor includes a plurality of rollers.

23. The apparatus of claim 21, wherein the permeable member is located above the conveyance path of the substrate to deposit the material on the upwardly facing surface of the substrate.

24. The apparatus of claim 1, wherein the conveyor includes a gas hearth configured to support and convey the substrate in a generally horizontally extending orientation.

* * * * *